United States Patent [19]

Sekine et al.

[11] Patent Number: 4,668,337

[45] Date of Patent: * May 26, 1987

[54] DRY-ETCHING METHOD AND APPARATUS THEREFOR

[75] Inventors: Makoto Sekine, Yokohama; Haruo Okano; Yasuhiro Horiike, both of Tokyo, all of Japan

[73] Assignee: Kabushiki Kaisha Toshiba, Kawasaki, Japan

[ * ] Notice: The portion of the term of this patent subsequent to Jul. 16, 2002 has been disclaimed.

[21] Appl. No.: 774,721

[22] Filed: Sep. 11, 1985

[30] Foreign Application Priority Data

Sep. 21, 1984 [JP] Japan .................................. 59-197904

[51] Int. Cl.$^4$ .......................................... H01L 21/306
[52] U.S. Cl. .................................... 156/643; 156/646; 156/345
[58] Field of Search ............ 156/643, 646, 657, 659.1, 156/662, 345; 204/192 E, 298; 252/79.1

[56] References Cited

U.S. PATENT DOCUMENTS

| 4,123,663 | 10/1978 | Horiike | 204/192 E |
| 4,183,780 | 1/1980 | McKenna et al. | 156/646 |
| 4,529,475 | 7/1985 | Okano et al. | 204/298 |

FOREIGN PATENT DOCUMENTS

| 52-127765 | 10/1977 | Japan . |
| 55-113329 | 9/1980 | Japan . |
| 59-33830 | 2/1984 | Japan . |

Primary Examiner—Ivars Cintins
Attorney, Agent, or Firm—Oblon, Fisher, Spivak, McClelland & Maier

[57] ABSTRACT

A dry-etching method for performing anisotropic etching on a semiconductor substrate by employing an etching gas together with a film-forming gas while irradiating light or an X-ray on the semiconductor substrate. In this method at least one of the etching gas or film-forming gas is excited in a separated chamber before being introduced into an etching chamber. A dry-etching apparatus for performing the above dry-etching method is also proposed.

25 Claims, 8 Drawing Figures

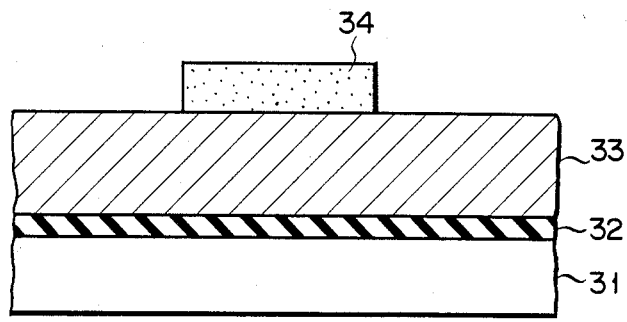
F I G. 2A
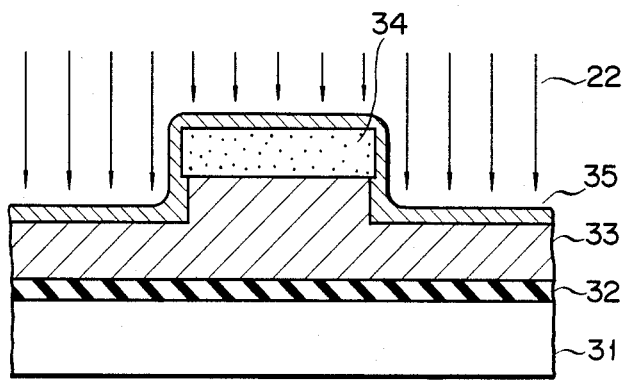
F I G. 2B
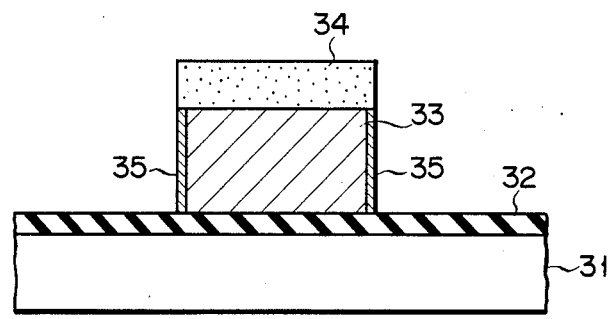
F I G. 2C

DRY-ETCHING METHOD AND APPARATUS THEREFOR

BACKGROUND OF THE INVENTION (a) Field of the Invention

The present invention relates to a dry-etching method utilizing a photochemical reaction, and an apparatus therefor.

(b) Description of the Prior Art

IC patterns are recently being micronized, and some trial products with a minimum pattern size on the order of 1 to 2 $\mu$m, or even submicrons have been developed. Plasma etching is indispensable for such micropatterning. In a conventional plasma etching apparatus, a reactive gas such as $CF_4$ is supplied to a chamber having parallel plate electrodes, and 13.56-MHz RF power is supplied across the electrode having a wafer thereon. A glow discharge occurs between the electrodes to generate a plasma. Positive ions in the plasma are accelerated by a cathode voltage drop, and the accelerated positive ions bombard the surface of the wafer to perform plasma etching. This etching technique is called reactive ion etching (RIE) and plays a major role in state-of-the-art micropatterning.

According to this technique, however, since the wafer to be etched is placed in the plasma, the following radiation damage occurs: the oxide film is damaged by charged particles such as ions and electrons, a threshold voltage of the resultant element is shifted by a soft X-ray, traps are formed in the oxide film, metal impurities from the inner wall surface of the chamber are introduced, and the like. Such radiation damage often results in decisive failures of VLSIs. Demand has arisen for developing an etching technique free of radiation damage.

Many conventional etching techniques, free of radiation damage, have been reported. Typical examples are anisotropic etching of Si or poly-Si by an atomic F beam having kinetic energy generated by a gas temperature in the glow discharge (e.g., H. Akiya, Proc. 3rd. Symp. on Dry Processes, P. 119 (1981)), and etching using laser or ultraviolet light (e.g., T. J. Chuang, J. Chem. Phys. 74, 1453 (1981); and H. Okano, T. Yamazaki, M. Sekine and Y. Horiike, Proc. of 4th Symp. on Dry Processes, P. 6 (1982)). Thus, possible non-damaging anisotropic etching techniques have been proposed.

According to extensive studies of the present inventors, it was found that the same effect as in ion-assist etching (e.g., J. W. Coburn and H. F. Winters, J. Appl. Phys. 50, 3189 (1979)) was obtained by poly-Si etching in a $Cl_2$ atmosphere upon radiation of an ultraviolet ray emitted from an Hg-Xe lamp (e.g., H. Okano, T. Yamazaki, M. Sekine and Y. Horiike, Proc. of 4th Symp. on Dry Processes, P. 6 (1982)). In other words, the etching reaction on the irradiated surface was greater than that of a non-irradiated surface. This effect is typically observed in undoped poly-Si, single crystal Si and p-type boron-doped Si. In addition, such an effect can also be observed in $n^+$-type poly-Si, or in Mo, W, Ta or their silicides.

However, according to the above method, the following problem is presented. Reactive gas radicals dissociated in the gas phase propagate under a mask, and light is slightly scattered from the etching surface. In this case, the region under the mask is etched, i.e., an undercut occurs. In particular, when the etching mask comprises a photoresist mask, the mask is transparent to light, and light irradiates under the resist mask. As a result, an undercut tends to form. The undercut is the major cause preventing micropatterning of the element, resulting in a decisive drawback for VLSIs.

The following recent RIE studies have been reported. Side etching is prevented (e.g., C. J. Mogab and H. J. Levinstein, J. Vac. Sci. Technol. 17, 721 (1980)) by rebonding Cl radicals as an etchant and $CF_4$ radicals, derived from $C_2F_6$, as an additive gas. Various unsaturated monomers such as decomposites of the resist and discharge products are attached to the etched wall surface to prevent bombardment by the etchant (e.g., R. H. Bruce and G. P. Malafsky, E.C.S. Meeting, Abs. No. 288, Denver, (1981); or T. Yamazaki, H. Okano and Y. Horiike, 30th Appl. Phys. Prec., Spring Committee, 1983).

SUMMARY OF THE INVENTION

It is an object of the present invention to provide a dry-etching method and an apparatus therefor, wherein radiation damage and undercutting of a substrate to be etched can be suppressed.

It is another object of the invention to attain micropatterning and a high integration density of semiconductor devices.

According to an aspect of the present invention, there is provided a dry-etching method for etching a substrate exposed to an etching gas upon radiation of light or an X-ray perpendicularly to or substantially perpendicularly to a surface of a portion to be etched; wherein the etching gas, together with a film formation gas, is brought into contact with the substrate, at least one of the etching and film formation gases is excited in a chamber other than an etching chamber having the substrate therein, and a mixture of the etching and film formation gases is supplied to the etching chamber.

According to another aspect of the present invention, there is provided a dry-etching apparatus having a vacuum chamber containing a substrate for etching, means for supplying an etching gas to the vacuum chamber, means for evacuating the vacuum chamber, and means for emitting light or an X-ray perpendicularly or substantially perpendicularly with respect to a surface of a portion to be etched; wherein means for supplying a film formation gas to the vacuum chamber is provided, at least one of the etching and film formation gas supplying means is connected to gas exciting means, at least one of the etching and film formation gases is excited, and a mixture of the etching and film formation gases is supplied to the vacuum chamber.

The main feature of the present invention is based on utilization of a competitive reaction of etching and film formation. The reaction gas itself is not directly supplied to the chamber having the substrate therein, but, rather, active species (active species of the film formation gas or of both the etching and film formation gases) generated by a chamber different from the vacuum chamber are introduced.

According to the present invention, etching can be performed by selecting a reaction gas (i.e., the etching gas) and a deposition gas. Since at least one of the gases is excited and then supplied to the vacuum chamber, charged particles are not used; but the substrate can be selectively etched, with high efficiency, upon radiation of light or X-rays. For this reason, etching can be performed without damage. The present invention is very advantageous in semiconductor device fabrication. Furthermore, anisotropic etching can be performed by utilizing a competitive reaction of etching and film formation. As a result, micropatterning and a high packing density of a semiconductor device can be achieved.

BRIEF DESCRIPTION OF THE DRAWINGS

FIGS. 2A to 2C are, respectively, sectional views explaining etching steps;

DESCRIPTION OF THE PREFERRED EMBODIMENTS

Figure 1:
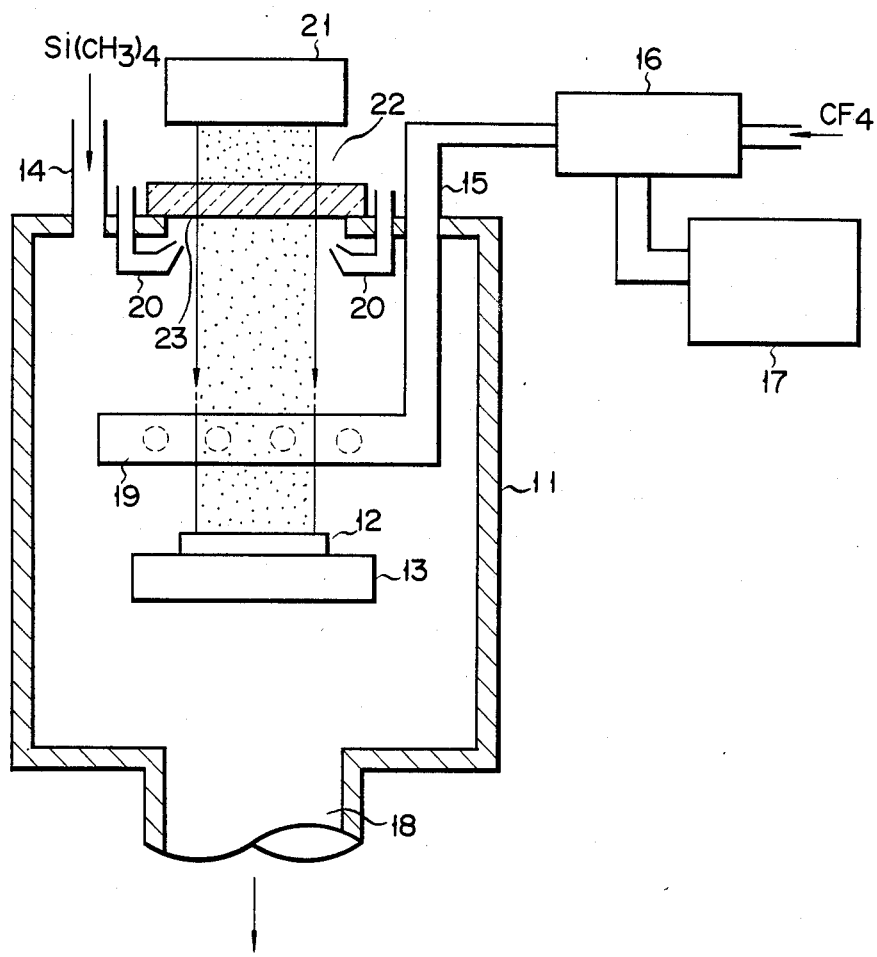
FIG. 1 is a schematic diagram showing a dry-etching apparatus according to a first embodiment of the present invention.

FIG. 1 schematically shows a dry-etching apparatus according to a first embodiment of the present invention. Reference numeral 11 denotes a vacuum chamber (i.e., a reaction chamber) constituting an etching chamber. A susceptor 13 having a substrate 12 thereon is placed in the chamber 11. A gas supply port 14 is formed at the upper portion of the chamber 11 to supply a film formation or source gas such as $Si(CH_3)_4$. A gas supply port 15 is also formed at the upper portion of the chamber 11 to supply active species of a reactive gas (i.e., an etching gas) such as $CF_4$. A microwave discharge tube 16 is connected to the port 15, and RF power is supplied from a power supply 17 to the tube 16. The reaction gas supplied to the tube 16 is excited therein to generate chemically active gas radicals. These radicals are supplied to the chamber 11 through the port 15. When $CF_4$ is used as the reaction gas, fluorine gas radicals are supplied to the chamber 11. A gas exhaust port 18 is formed in the wall of the chamber 11 to evacuate the chamber 11.

The reaction gas supplied to the chamber 11 through the port 15 is, preferably, sprayed as uniformly as possible above the substrate 11 and through an annular gas spray tube 19 surrounding the substrate. This arrangement is also employed in an arrangement (not shown) for the film formation gas.

A light source 21 is arranged above the chamber 11. The light source 21 comprises a short-wavelength light source such as a 308-nm XeCl laser or 193-nm ArF excimer laser. A ray 22 from the light source 21 is guided into the chamber 11 through an ultraviolet ray transmission window 23, and the ray 22 is vertically incident on the upper surface of the substrate 12 on the susceptor 13.

Reference numerals 20 denote gas supply nozzles which surround the window 23. An inert gas is sprayed from the nozzles 20 to the lower surface of the window 23 so that a film will not be deposited thereon.

A dry-etching method, by using the apparatus described above, will be described hereinafter.

A 6,000 Å thick phosphorus-doped poly-Si was used as an etching sample. As shown in FIG. 2A, an $SiO_2$ film 32 was deposited on an Si substrate 31 at a temperature of 20° C. and to a thickness of 1,000 Å. A phosphorus-doped poly-Si film 33, as the sample of interest, was deposited on the film 32. A photoresist etching mask 34 was formed on the film 33 to a thickness of 1.0 to 1.5 μm.

The substrate 12 having the structure described above was placed on the susceptor 13 of the etching apparatus of FIG. 1, and etching was performed as follows. $CF_4$, as the reaction gas for forming active species, and $Si(CH_3)_4$, as the film formation gas, were supplied to the chamber 11. Light from the light source 21 was a 308-nm XeCl excimer laser (160 Hz·sec$^{-1}$). The chamber 11 was kept at a vacuum of 0.5 Torr. The active species (F radicals) of the $CF_4$ gas, activated through the tube 16 (1 W/cm$^2$), and the $Si(CH_3)_4$, as the film formation gas (10% by volume of the total volume of the gas), were supplied to the chamber 11. At the same time, the ultraviolet ray 22 was also guided to the chamber 11. The fluorine radicals supplied to the chamber were used to etch the film 33. Meanwhile, $Si(CH_3)_4$ reacted with the fluorine radicals to form a nonvolatile compound such as $Si(CH_3)_2F_2$. This nonvolatile compound was deposited on the surfaces of the film 33 and the mask 34. The film deposited on the film 33 protected the film 33 from the F radicals, and no etching was performed in this portion. However, on a portion subjected to ultraviolet radiation, etching progressed by a light-assist effect (mainly thermal reaction evaporation or photochemical reaction), as compared with the deposition reaction, thereby performing vertical etching. As a result, anisotropic etching, free of an undercut, was achieved at an etching rate of 2,000 Å/min.

Referring to FIG. 2B, after the film 33, as the sample of interest, is partially etched, the light is shielded to stop etching. In this case, the deposition reaction progresses continuously, and $Si(CH_3)_4$ reacts with fluorine radicals to uniformly deposit a film (deposition film) 35 or $Si(CH_3)_2F_2$ on the surface of the substrate 12. A portion of the substrate is again irradiated with the vertical light ray 22, the deposition film on the irradiated surface is immediately etched, and the film 33 is further etched, as shown in FIG. 2C. The deposition rate on the surface of the side wall which is not subjected to ultraviolet radiation is higher than the etching rate, so that the very thin deposition film 35 protects the side wall, thereby performing anisotropic etching. Since the deposition film (protection film) 35 on the side wall surface is very thin, as shown in FIGS. 2B and 2C, the pattern precision will not be substantially degraded.

According to this embodiment, without using charged particles such as electrons and ions, the film 33, as the sample of interest, can be selectively etched upon radiation of the light. Furthermore, the competitive reaction of etching and film formation is used so that anisotropic etching can be performed. Micropatterning and a high packing density of the semiconductor element can, therefore, be achieved. In this embodiment, fluorine atom radicals obtained by activating $CF_4$ are used as the active species of the reaction gas. However, when oxygen or nitrogen is added to the reaction gas, the side wall protection film can be an $SiO_2$ or $Si_3N_4$ film. Such a film is stronger than the $Si(CH_3)F_2$ film and effectively prevents an undercut.

Figure 3:
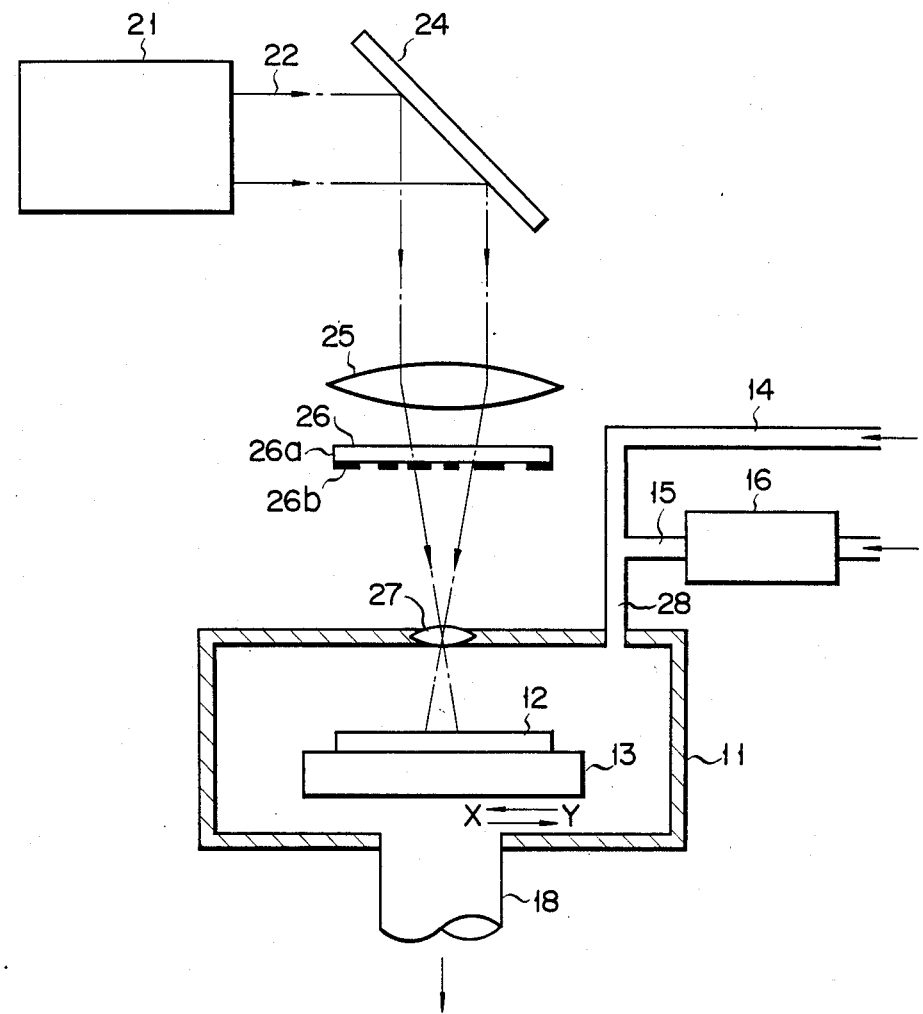
FIG. 3 is a schematic diagram showing a dry-etching apparatus according to a second embodiment of the present invention.

FIG. 3 schematically shows a dry-etching apparatus according to a second embodiment of the present invention. The same reference numerals in FIG. 3 denote the same parts as in FIG. 1, and a detailed description thereof will be omitted. In the same manner as in the first embodiment, a substrate 12 fixed on a susceptor 13 is placed in a chamber 11. The film formation gas and the active species of the reaction gas are supplied through a common gas supply port 28. A window/lens 27 is arranged at the upper portion of the chamber 11.

A ray 22 from a light source 21 is reflected by a reflecting mirror 24 and passes through a lens 25 and a mask 26 having a pattern. The light passing through the mask 26 is guided into the chamber 11 through the window/lens 27, and is focused on the substrate 12. It should be noted that the mask 26 has a desired pattern 26b of a metal, such as Al, which does not transmit light on a base 26a which does.

According to the second embodiment, a mask pattern such as a photomask pattern is formed on the substrate 12. The pattern of the mask 26 located outside the chamber 11 is optically focused to perform anisotropic etching on the irradiated surface, thereby forming the desired pattern. The principle of anisotropy is the same as in the first embodiment.

The material of the lens 25, the window/lens 27 and the mask substrate which can effectively transmit the ray 22 can be properly selected from molten quartz, high-purity alumina, lithium fluoride and magnesium fluoride. In order to form a micropattern used in a VLSI, a vacuum ultraviolet ray or an X-ray having a short wavelength must be used. In this case, the region for transmitting light therethrough must be purged with $N_2$, or the chamber must be evacuated. When the pattern is transferred by using light having such a short wavelength, a large area cannot be simultaneously irradiated with the light. In this embodiment, the susceptor 13 is scanned along the X- and Y-axes so that step-and-repeat etching for each chip is performed.

Figure 4:
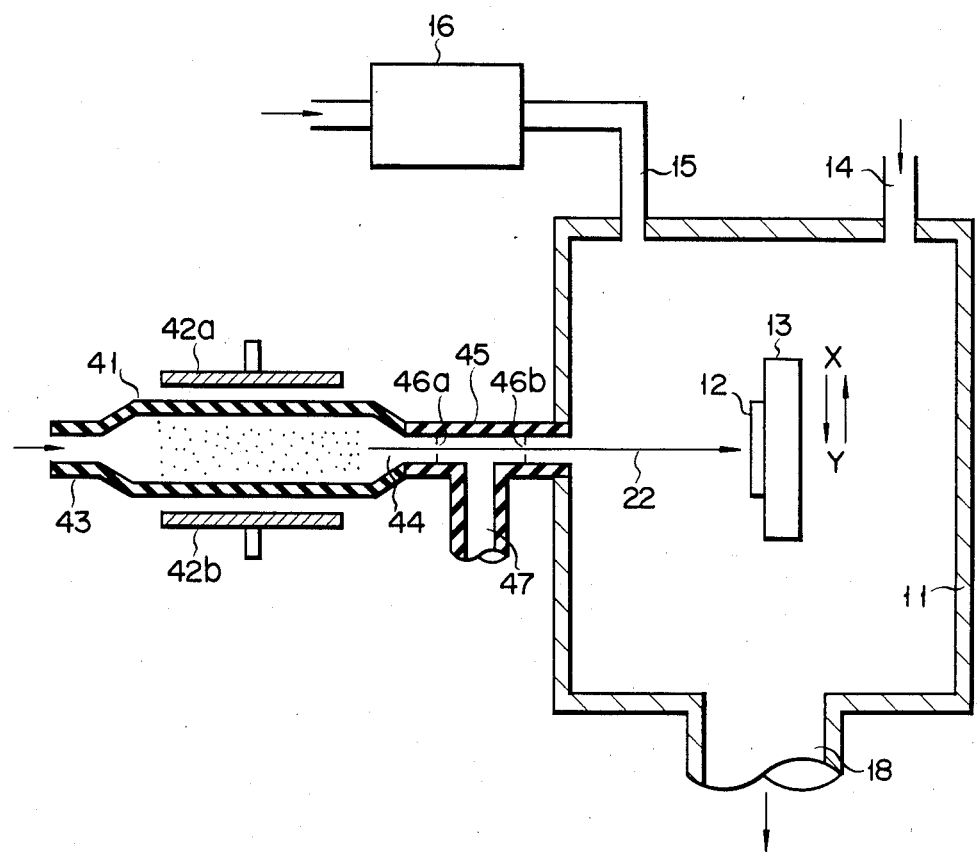
FIG. 4 is a schematic diagram showing a dry-etching apparatus according to a third embodiment of the present invention.

FIG. 4 schematically shows a dry-etching apparatus according to a third embodiment of the present invention. The same reference numerals in FIG. 4 denote the same parts as in FIG. 1, and a detailed description thereof will be omitted. The third embodiment is substantially the same as the first embodiment, except that a vacuum ultraviolet ray is used as the light radiation means. The means for supplying the film formation gas and the active species of the reaction gas are the same as those of the first embodiment.

A quartz discharge tube 41 is arranged to the left of the vacuum tube 11. Electrodes 42a and 42b oppose each other through the tube 41. An Ar gas is supplied to the tube 41 through a gas supply tube 43 and is exhausted through an exhaust port 44 so that the pressure in the interior of the tube 41 is kept constant. When 13.56-MHz RF power is supplied across the electrodes 42a and 42b, Ar in the tube 41 can be easily excited to generate a high-energy beam having a wavelength of 100 nm. A ray 22 is guided into the chamber 11 through a tube 45. Apertures 46a and 46b are formed in the tube 45. The tube 41 is evacuated through a tube 47 (differential evacuation) so that the gas in the tube 41 will not be mixed with the gas in the chamber 11.

In this embodiment, since the vacuum ultraviolet ray 22 guided into the chamber 11 has a short wavelength, a very thin pattern can be formed. Furthermore, since the ray 22 has high energy, an insulating film such as $SiO_2$ can be effectively etched.

Figure 5:
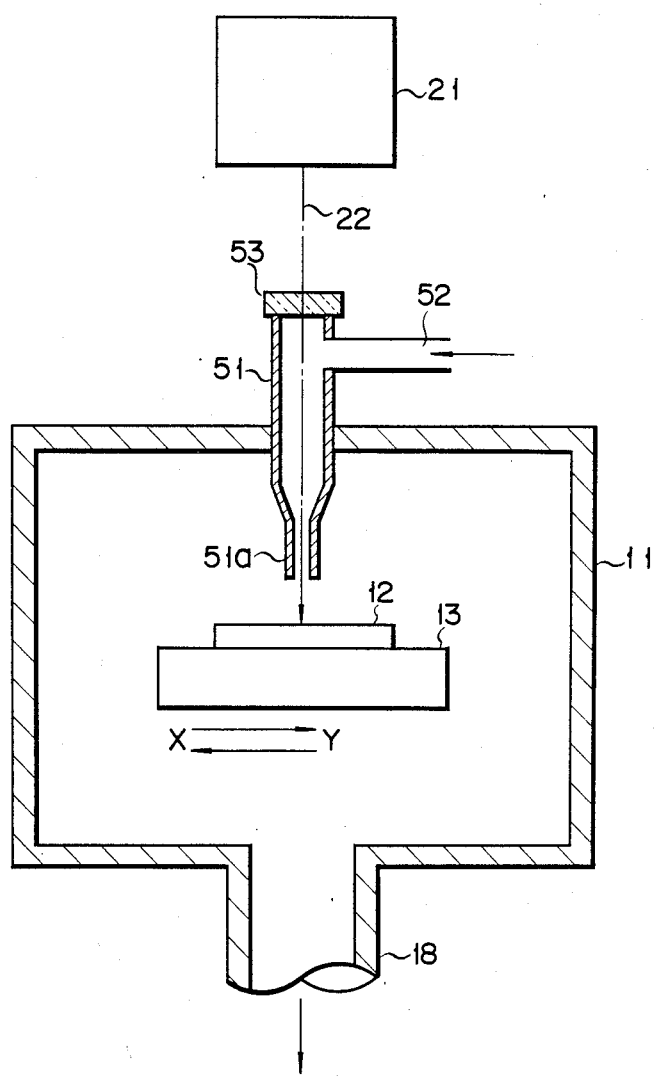
FIG. 5 is a schematic diagram showing a dry-etching apparatus according to a fourth embodiment of the present invention.

FIG. 5 schematically shows a dry-etching apparatus according to a fourth embodiment of the present invention. The same reference numerals in FIG. 5 denote the same parts as in FIG. 1, and a detailed description thereof will be omitted. The fourth embodiment is substantially the same as the first embodiment, except that the film formation gas, the active species of the reaction gas, and light are all supplied via the same portion, as opposed to being supplied via different portion, as in the third embodiment.

A supply tube 51 having a slit 51a at its lower portion extends through the upper wall of a vacuum chamber 11. The film formation gas and the reaction gas are supplied to the tube 51 through a gas supply port 52. A ray 22 from a light source 21 is guided into the tube 51 through a transparent plate 53 and is incident on a substrate 12 through the slit 51a. The reaction gas and the film formation gas in the tube 51 are activated and supplied in the chamber 11.

In this embodiment, a mixture of the active species of the reaction gas, excited by the ray 22, and the film formation gas (active species of the film formation gas) is sprayed on the substrate 12 by utilizing the pressure difference between the nozzle 51a and the interior of the chamber 11. In order to achieve the same anisotropy as in the first embodiment, a side wall protection film is formed to etch an irradiated surface. In addition, by utilizing the gas pressure difference to spray the gas mixture, the anisotropic shape can also be improved. The slit of the nozzle 51a has a width greater than that of the substrate 12. The susceptor 13 is scanned along one direction (i.e. an X-Y direction) to etch the entire surface of the substrate 12. In this case, the active species of the reaction gas may, upon radiation of the light, be replaced with other active species generated by microwave discharge or the like to obtain the same effect. In this case, a wavelength of the light source 21 can be arbitrarily selected in accordance with the type of sample to be etched.

Figure 6:
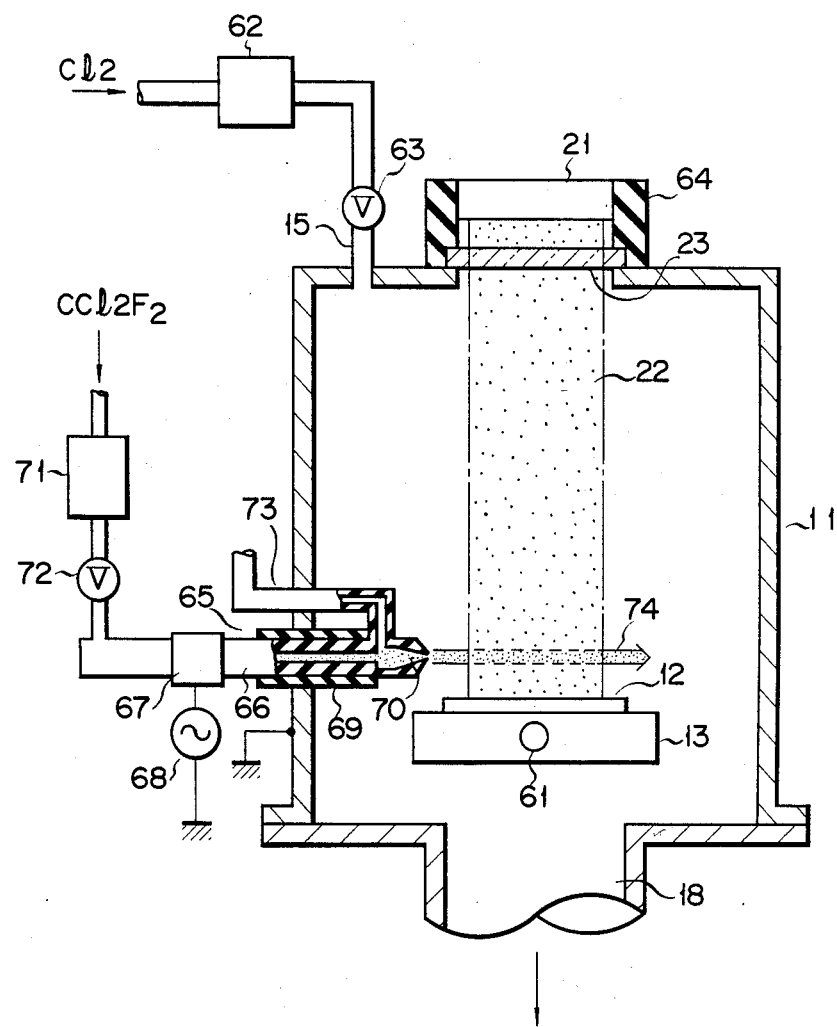
FIG. 6 is a schematic diagram showing a dry-etching apparatus according to a fifth embodiment of the present invention.

FIG. 6 schematically shows a dry-etching apparatus according to a fifth embodiment of the present invention. The same reference numerals in FIG. 6 denote the same parts as in FIG. 1, and a detailed description thereof will be omitted. This embodiment is substantially the same as the first embodiment, except that the film formation gas is supplied as an active species.

The vacuum chamber 11 and the susceptor 13 are made of stainless steel. The susceptor 13 can be moved toward the lower surface of the drawing by a drive mechanism (not shown) through a drive shaft 61. $Cl_2$, as the reaction gas, is supplied to the chamber 11 through a flow controller 62 and a needle valve 63. The flow rate of $Cl_2$ is adjusted so as, ultimately, to be 20 ml/min. A laser, as the light source 21, is fixed by a support member 64 on the upper wall of the chamber 11. A ray 22 having a rectangular section and emitted from the light source 21 is vertically incident on the substrate 12 through a light transmission window 23.

A microwave discharge mechanism 65 is fixed on the surface of the left wall of the chamber 11. The mechanism 65 comprises an alumina discharge tube 66 extending through the wall of the chamber 11 and an annular electrode 67 which surrounds the tube 66. A 13.56-MHz RF power supply 68 is connected to the electrode 67. The tube 66 is fixed by an insulating support member 69 to the chamber 11. $CCl_2F_2$, as the film formation gas, is supplied to the tube 66 through a controller 71 and a valve 72, and the flow rate of $CCl_2F_2$ is set so as, ultimately, to be 50 ml/min. The pressure in the interior of the tube 66 is set to be 1 Torr. For this reason, the tube 66 is connected to a bypass exhaust tube 73 to adjust the pressure of the interior of the tube 66. The distal end of the tube 66 constitutes a nozzle 70. Neutral radicals in the plasma, generated in the tube 66, are sprayed from the nozzle 70. The ions in the plasma disappear immediately and are sprayed through the nozzle 70. The chamber 11 is evacuated at a vacuum of $10^{-2}$ Torr. Therefore, a gas 74 having kinetic energy imparted by the gas from the nozzle of the tube 66 constitutes a jet beam parallel with the substrate 12.

In this embodiment, when a poly-Si film is used as the etching sample, the poly-Si film is etched by chlorine dissociated by the ray 22. $CCl_2$ and $C_2Cl_4$ are attached to the surfaces of the side walls of the etched poly-Si film and serve as protection films against etching. Therefore, anisotropic etching can be achieved in the same manner as in the first embodiment.

The present invention is not limited to the particular embodiments described above. The above embodiments exemplify etching. However, the present invention can also be applied to film formation. For example, in the apparatus of FIG. 1, $Si(CH_3)_4 + O_2$ may be used as the film formation gas, and $CCl_4$ may be used as the reaction gas. In this case, a film can be deposited on the substrate. Light radiation heats the substrate and causes electronic excitation, thereby accelerating the deposition reaction on the irradiated surface. A film may be selectively deposited on only the irradiated portion.

Any reaction gas can be used when the gas contains a halogen atom such as Cl or F and can be activated by microwave discharge, glow discharge, arc discharge, microwave discharge or photoexcitation, or multiple lattice absorption to generate active species. The film formation gas is not limited to $Si(CH_3)_4$, but can be selected from organic metal compounds (e.g., organic silane compounds, organic germanium compounds, organic aluminum compounds, organic phosphine compounds, organic borane compounds and organic arsine compounds), or their halogen derivatives; or from silanes, arsines or phosphines. The light emitted on the substrate is not limited to the excimer laser. Any light component can be used when the light has a wavelength sufficient to evaporate the deposition film and accelerate a reaction between the deposition film and the active species of the reaction gas. An X-ray can be used in place of light. The sample to be etched must easily react with the active species of the reaction gas, and can be selected from a semiconductor material such as silicon or germanium; a metal material such as aluminum, tungsten or molybdenum; or an insulating material such as silicon oxide or silicon nitride. Various changes and modifications may be made without departing from the scope and spirit of the invention.

What is claimed is:

1. A dry-etching method for etching a substrate, said method comprising the steps of:
   (a) disposing a substrate having a surface to be etched in an etching chamber;
   (b) exciting at least one of an etching gas and a film formation gas in a chamber other than the etching chamber; and
   (c) introducing both the etching gas and the film formation gas into the etching chamber while
   (d) irradiating light or X-ray radiation at least substantially perpendicularly to the surface.

2. A method according to claim 1, wherein said substrate is irradiated with the light or X-ray radiation through a mask, having a desired pattern, which has a light or X-ray transmission portion and a light or X-ray shielding portion, thereby promoting selective etching of an irradiated portion.

3. A method according to claim 1, wherein an etching mask is formed on said surface of said substrate, and a nonmasked portion of said substrate is selectively etched.

4. A method according to claim 1, wherein said etching gas is a gas selected from the group consisting of a halogen gas, a gas containing a halogen, and a gas mixture of a halogen gas and one of nitrogen and oxygen.

5. A method according to claim 1, wherein said film formation gas is a gas containing at least one of nitrogen and oxygen.

6. A method according to claim 1, wherein said film formation gas is a gas selected from the group consisting of an organic metal compound including an organic silane compound, an organic germanium compound, an organic gallium compound, an organic phosphine compound, an organic borane compound and an organic arsine compound; a halogen derivative thereof; and silanes, arsines and phosphines.

7. A method according to claim 1, wherein the light or X-ray radiation has a wavelength sufficient to evaporate a thin film deposited on said substrate and to accelerate a reaction between an active species and said thin film.

8. A method according to claim 1, wherein the light or X-ray radiation is excited by light or radio-frequency excitation.

9. A method according to claim 1, wherein said substrate is moved along a direction perpendicular to an incident direction of the light or X-ray so as to perform etching over a desired range.

10. A method according to claim 1, wherein said etching gas is uniformly sprayed onto said substrate from its periphery.

11. A method according to claim 1, wherein said film formation gas is uniformly sprayed onto said substrate from its periphery.

12. A method according to claim 1, wherein the light radiation is a laser beam.

13. A method according to claim 1, wherein at least one of said etching and film formation gases is sprayed from the same port through which the light of X-ray radiation passes.

14. A dry-etching apparatus comprising:
   (a) a vacuum chamber in which, during use of the apparatus, a substrate for etching is disposed;
   (b) means for supplying an etching gas to said vacuum chamber;
   (c) means for evacuating said vacuum chamber;
   (d) means for emitting light or X-ray radiation at least substantially perpendicularly with respect to a surface of the substrate to be etched;
   (e) means for supplying a film formation gas to said vacuum chamber; and
   (f) gas exciting means separated from said vacuum chamber connected to at least one of said etching and film formation gas supplying means.

15. An apparatus according to claim 14, wherein said etching gas supply means includes means for uniformly spraying the etching gas onto the substrate.

16. An apparatus according to claim 14, wherein said film formation gas supply means includes means for uniformly spraying the film formation gas onto the substrate.

17. An apparatus according to claim 14, wherein said vacuum chamber has a light or X-ray radiation transmission window, with means being provided for spraying an inert gas onto said window.

18. An apparatus according to claim 14, wherein said light or X-ray radiation emitting means includes means for focusing a desired pattern on a surface of the substrate.

19. An apparatus according to claim 14, wherein said etching gas supply means and said film formation gas supply means are commonly connected to said vacuum chamber.

20. An apparatus according to claim 14, and further comprising means for moving a substrate disposed in said vacuum chamber in a direction perpendicular to the light or X-ray radiation direction.

21. An apparatus according to claim 14, wherein said light or X-ray radiation emitting means includes means for forcibly evacuating a radiation path.

22. An apparatus according to claim 14, wherein said gas exciting means is connected to said etching gas supplying means and comprises light or radio-frequency exciting means.

23. An apparatus according to claim 14, wherein said gas exciting means is connected to said film formation gas supplying means and comprises light or radio-frequency exciting means.

24. An apparatus according to claim 14, wherein a nozzle is provided in said vacuum chamber, said nozzle being arranged to commonly supply the light or X-ray radiation and the etching and film formation gases in said vacuum chamber.

25. An apparatus according to claim 24, wherein said nozzle has a slit which has a width greater than the length of the substrate.

* * * * *